(12) United States Patent
Cheng et al.

(10) Patent No.: US 10,141,403 B1
(45) Date of Patent: Nov. 27, 2018

(54) INTEGRATING THIN AND THICK GATE DIELECTRIC NANOSHEET TRANSISTORS ON SAME CHIP

(71) Applicant: INTERNATIONAL BUSINESS MACHINES CORPORATION, Armonk, NY (US)

(72) Inventors: Kangguo Cheng, Schenectady, NY (US); Juntao Li, Albany, NY (US); Geng Wang, Stormville, NY (US); Qintao Zhang, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/815,009

(22) Filed: Nov. 16, 2017

(51) Int. Cl.
*H01L 29/06* (2006.01)
*H01L 29/51* (2006.01)
*H01L 21/8234* (2006.01)
*H01L 21/84* (2006.01)
*H01L 21/306* (2006.01)
(Continued)

(52) U.S. Cl.
CPC .... *H01L 29/0665* (2013.01); *H01L 21/30604* (2013.01); *H01L 21/31144* (2013.01); *H01L 21/823462* (2013.01); *H01L 21/845* (2013.01); *H01L 29/0603* (2013.01); *H01L 29/42368* (2013.01); *H01L 29/511* (2013.01)

(58) Field of Classification Search
CPC ........... H01L 29/0665; H01L 29/42368; H01L 21/31144; H01L 21/30604; H01L 21/823462; H01L 29/511; H01L 29/0603; H01L 21/845
See application file for complete search history.

(56) References Cited

U.S. PATENT DOCUMENTS

| | | |
|---|---|---|
| 8,422,273 B2 | 4/2013 | Chang et al. |
| 8,492,228 B1 | 7/2013 | Leobandung et al. |
| 8,753,942 B2 | 6/2014 | Kuhn et al. |

(Continued)

OTHER PUBLICATIONS

Cheng et al., "Nanosheet Transistors Having Different Gate Dielectric Thicknesses on the Same Chip," U.S. Appl. No. 15/404,469, filed Jan. 12, 2017. pp. 1-38.

(Continued)

*Primary Examiner* — Karen Kusumakar
(74) *Attorney, Agent, or Firm* — Tutunjian & Bitetto, P.C.; Vazken Alexanian

(57) ABSTRACT

A method is presented for integrating a first nanosheet transistor and a second nanosheet transistor on a chip. The method includes forming a first stack of alternating layers for the first gate dielectric nanosheet transistor and a second stack of alternating layers for the second gate dielectric nanosheet transistor, removing a first set of sacrificial layers of the first stack of alternating layers of the first gate dielectric nanosheet transistor and removing a first set of sacrificial layers of the second stack of alternating layers of the second gate dielectric nanosheet transistor, and removing a second set of sacrificial layers of the first stack of alternating layers. The method further includes annealing a second set of sacrificial layers to subsequently remove the second set of sacrificial layers of the second stack of alternating layers, and forming a first gate dielectric nanosheet transistor and a second gate dielectric nanosheet transistor.

20 Claims, 10 Drawing Sheets

(51) Int. Cl.
*H01L 21/311* (2006.01)
*H01L 29/423* (2006.01)

(56) References Cited

U.S. PATENT DOCUMENTS

| | | | |
|---|---|---|---|
| 8,941,177 | B2 | 1/2015 | Adams et al. |
| 9,972,701 | B2 * | 5/2018 | Kim .................... H01L 29/0673 |
| 2008/0013594 | A1 | 6/2008 | Lo et al. |
| 2009/0206405 | A1 | 8/2009 | Doyle et al. |
| 2015/0123215 | A1 | 5/2015 | Obradovic et al. |
| 2015/0295084 | A1 | 10/2015 | Obradovic et al. |
| 2017/0179128 | A1 * | 6/2017 | Balakrishnan ...... H01L 27/0924 |

OTHER PUBLICATIONS

Tanaka et al., "Abnormal oxidation characteristics of SiGe/Si-on-insulator structures depending on piled-up Ge fraction at SiO2/SiGe interface," Journal of Applied Physics. vol. 103. No. 054909. Mar. 12, 2008. pp. 1-5.

* cited by examiner

INTEGRATING THIN AND THICK GATE DIELECTRIC NANOSHEET TRANSISTORS ON SAME CHIP

BACKGROUND

Technical Field

The present invention relates generally to semiconductor devices, and more specifically, to integrating thin and thick gate dielectric nanosheet transistors on a same chip.

Description of the Related Art

In nanometer scale devices, gate structures are often disposed between nanosheet structures or other conducting structures, such as nanosheets. In many instances, the conducting or semiconducting structures are formed closer together due to scaling to smaller node technology sizes. This can be a limiting factor in the reduction of device size scaling.

While fin field effect transistors (FinFETs) and/or nanosheets can benefit from tight device-device spacing, these dimensions can limit device scaling. Further, devices needing a thicker dielectric for higher voltage operation are even more limited in the allowable dimensions. Higher voltage devices for input and/or output circuits need thicker gate dielectrics as compared to standard gate devices, which have a lower voltage and can be employed, e.g., in logic devices. However, spacing between nanosheets needs to be small to realize capacitance benefits.

SUMMARY

In accordance with an embodiment, a method is provided for integrating a first gate dielectric nanosheet transistor and a second gate dielectric nanosheet transistor on a single chip. The method includes forming a first stack of alternating layers for the first gate dielectric nanosheet transistor and a second stack of alternating layers for the second gate dielectric nanosheet transistor, selectively removing a first set of sacrificial layers of the first stack of alternating layers of the first gate dielectric nanosheet transistor and selectively removing a first set of sacrificial layers of the second stack of alternating layers of the second gate dielectric nanosheet transistor, selectively removing a second set of sacrificial layers of the first stack of alternating layers, annealing a second set of sacrificial layers of the second stack of alternating layers to subsequently remove the second set of sacrificial layers of the second stack of alternating layers, and forming the first gate dielectric nanosheet transistor and the second gate dielectric nanosheet transistor.

In accordance with an embodiment, a method is provided for integrating a thin gate dielectric nanosheet transistor and a thick gate dielectric nanosheet transistor on a single chip. The method includes forming a first stack of alternating silicon (Si) and silicon germanium (SiGe) layers for the thin gate dielectric nanosheet transistor and a second stack of alternating Si and SiGe layers for the thick gate dielectric nanosheet transistor, depositing a first dielectric layer over the thin and thick gate dielectric nanosheet transistors, removing dummy gates of the thin and thick gate dielectric nanosheet transistors, selectively removing a first set of sacrificial SiGe layers of the first and second stacks of alternating layers such that a second set of sacrificial layers remains in direct contact with a Si layer of each of the first and second stacks of alternating Si and SiGe layers, selectively removing a second set of sacrificial SiGe layers of the first stack of alternating Si and SiGe layers such that only Si layers remain, oxidizing and removing a second set of sacrificial SiGe layers and Si layer sandwiched by the second set of sacrificial SiGe layers of the second stack of alternating Si and SiGe layers, and forming the first gate dielectric nanosheet transistor and the second gate dielectric nanosheet transistor.

In accordance with another embodiment, a semiconductor device is provided. The semiconductor device includes a thin gate dielectric nanosheet transistor including a top nanosheet, a bottom nanosheet, and one or more middle nanosheets formed between the top and bottom nanosheets and a thick gate dielectric nanosheet transistor including a top nanosheet, a bottom nanosheet, and one or more middle nanosheets formed between the top and bottom nanosheets. At least one middle nanosheet of the thick gate dielectric nanosheet transistor is removed to expand a gap between remaining nanosheets. Additionally, a thick oxide is formed between the top and bottom nanosheets of the thick gate dielectric nanosheet transistor such that the thick oxide pinches off a section of a spacer formed between the thick oxide and source and drain regions.

In accordance with another embodiment, a semiconductor structure is provided. The semiconductor structure includes a single nanosheet stack formed over a substrate, a thin gate dielectric nanosheet transistor formed by fabricating a first portion of the single nanosheet stack, the thin gate dielectric nanosheet transistor including a plurality of nanosheets separated from each other by a first distance, and a thick gate dielectric nanosheet transistor formed by fabricating a second portion of the single nanosheet stack, the thick gate dielectric nanosheet transistor including a plurality of nanosheets separated from each other by a second distance, the second distance being greater than the first distance.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Figure 2:
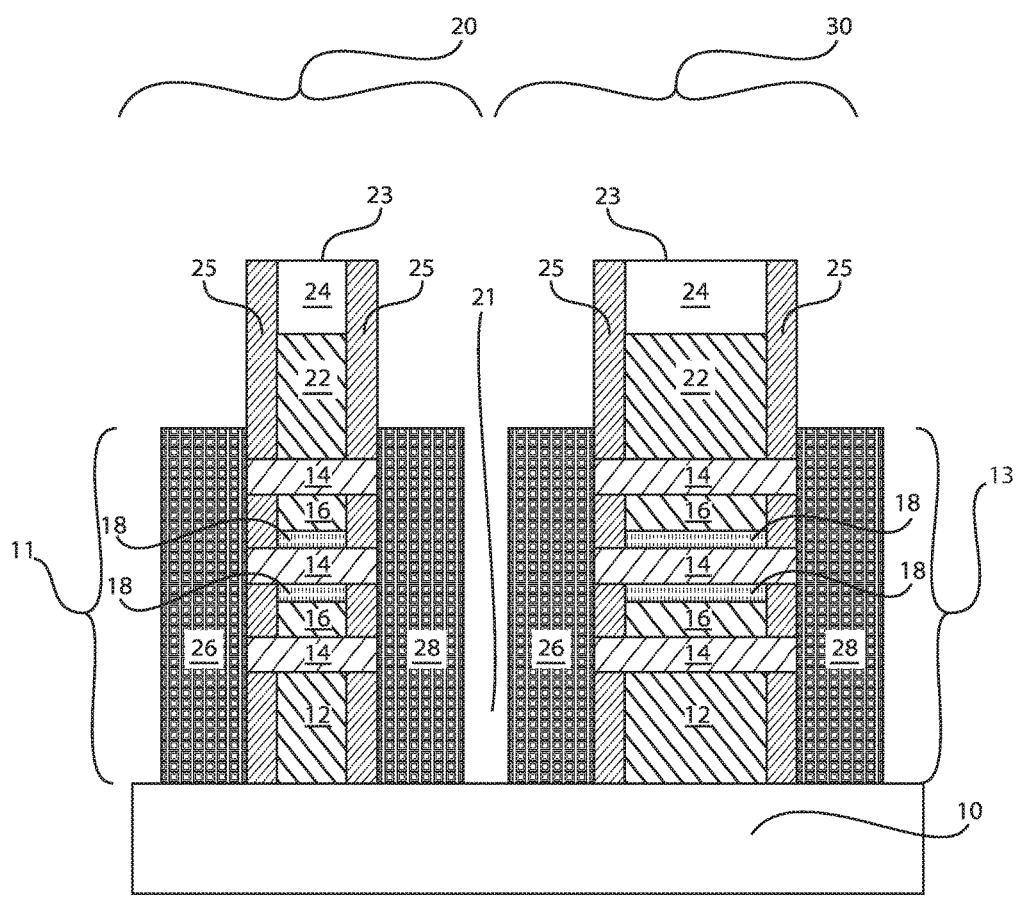
FIG. 2 is a cross-sectional view of the semiconductor structure of FIG. 1 where a nanosheet structure is formed including a thin gate dielectric field effect transistor (FET)
Figure 3:
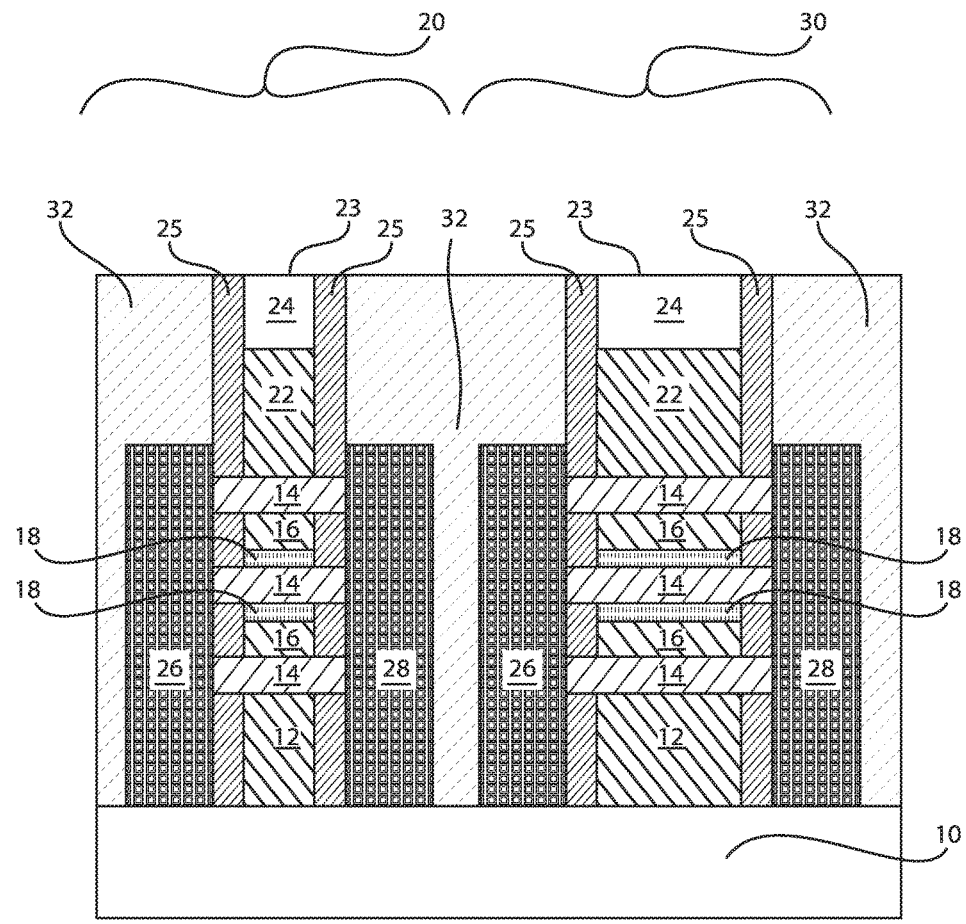
Figure 4:
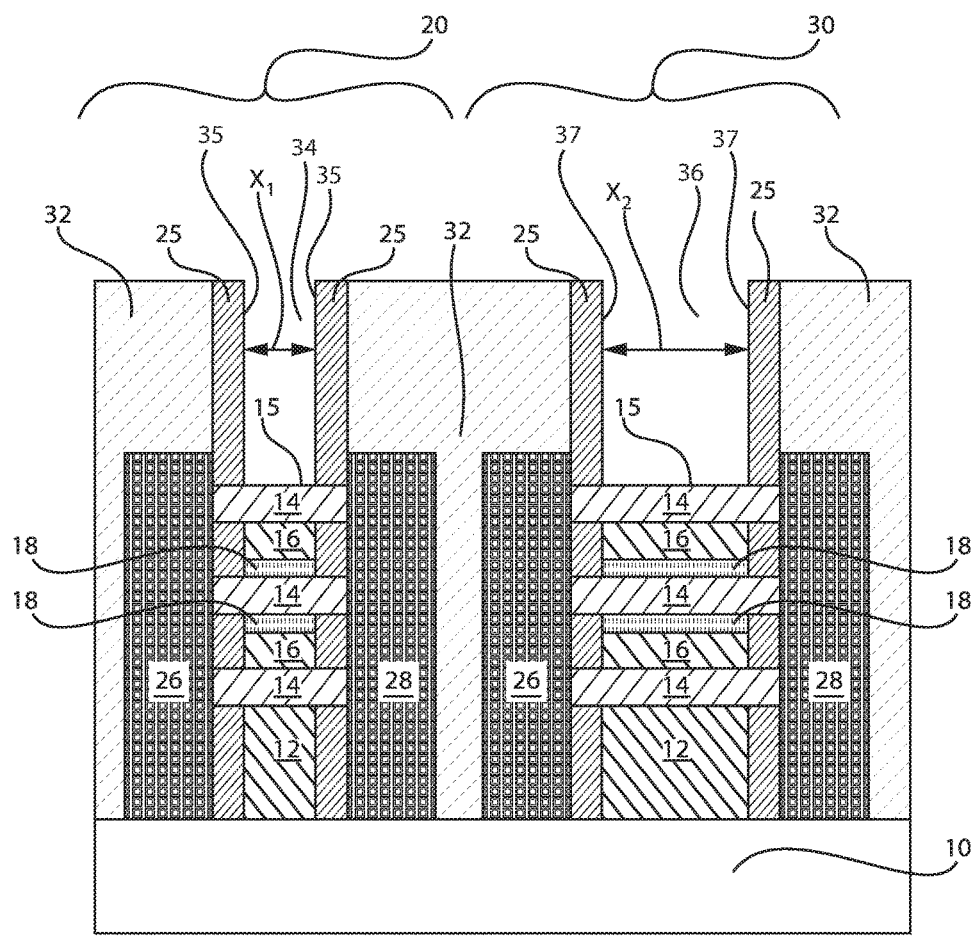
Figure 5:
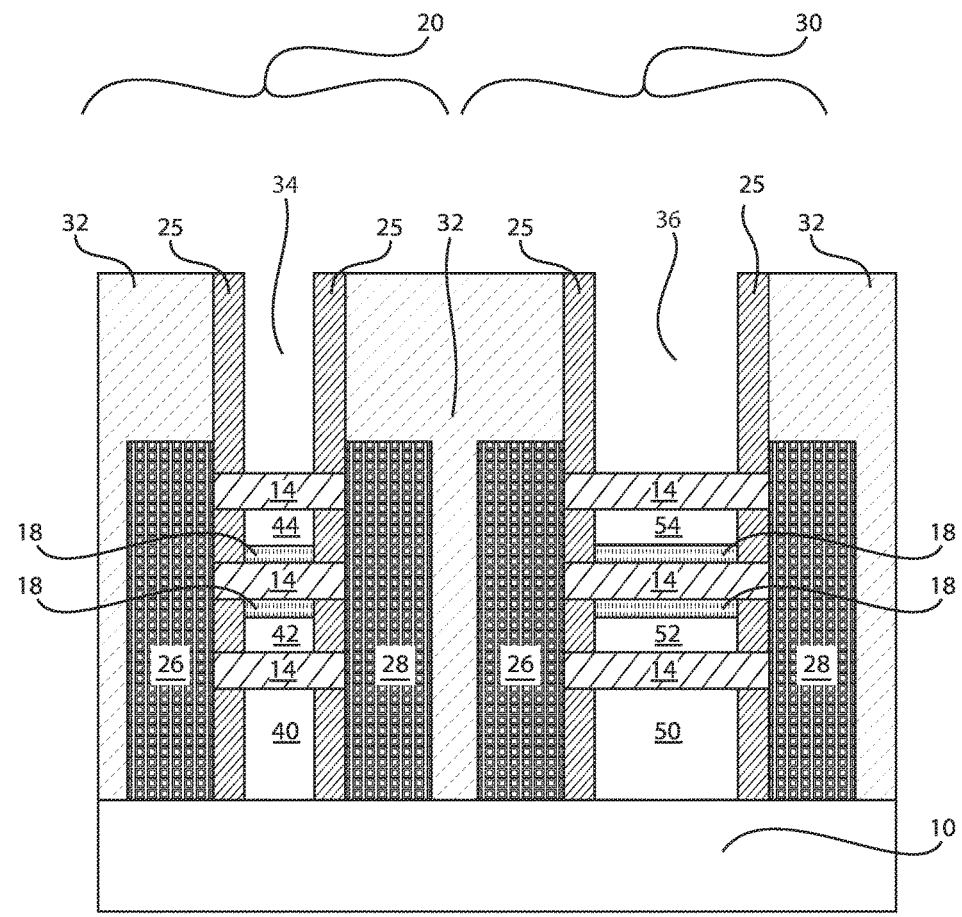
Figure 6:
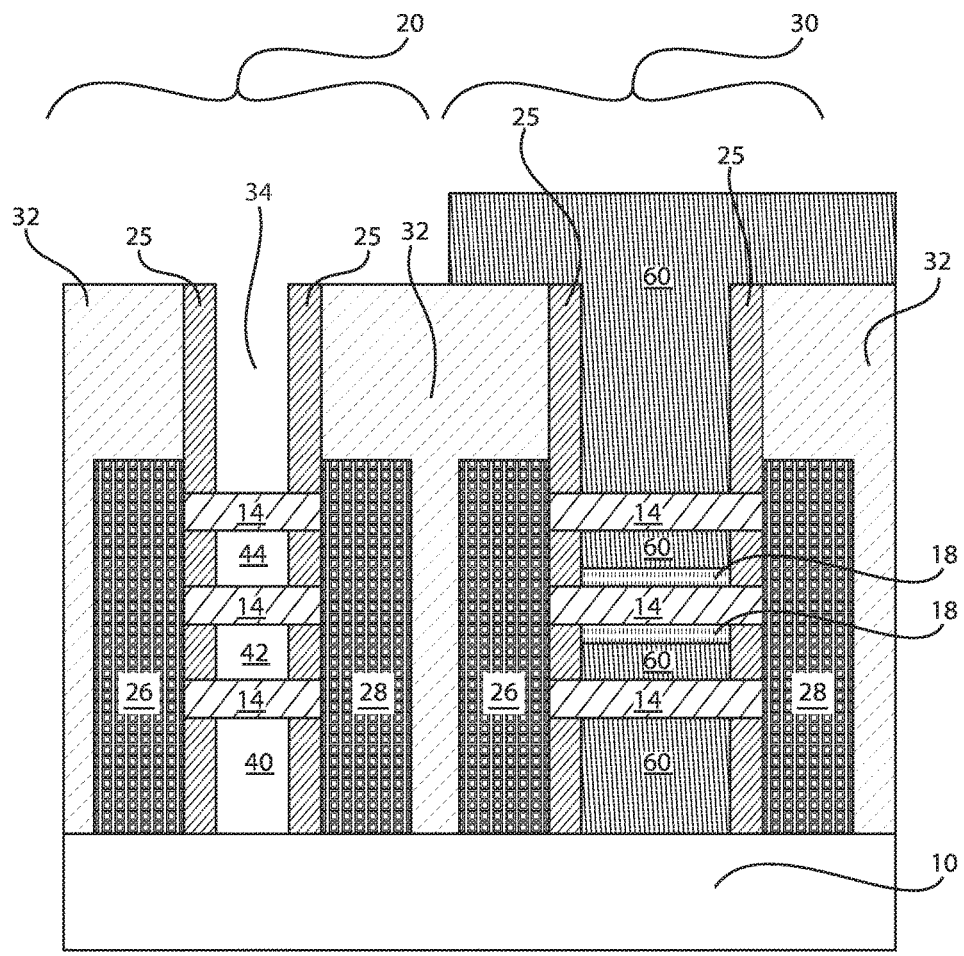
Figure 7:
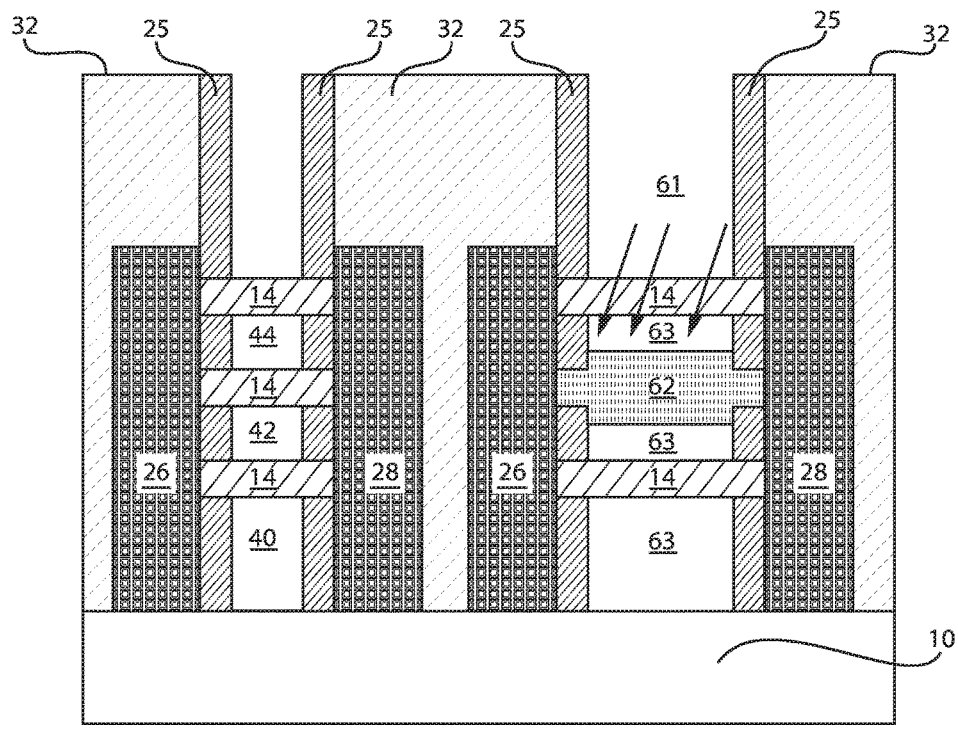
Figure 8:
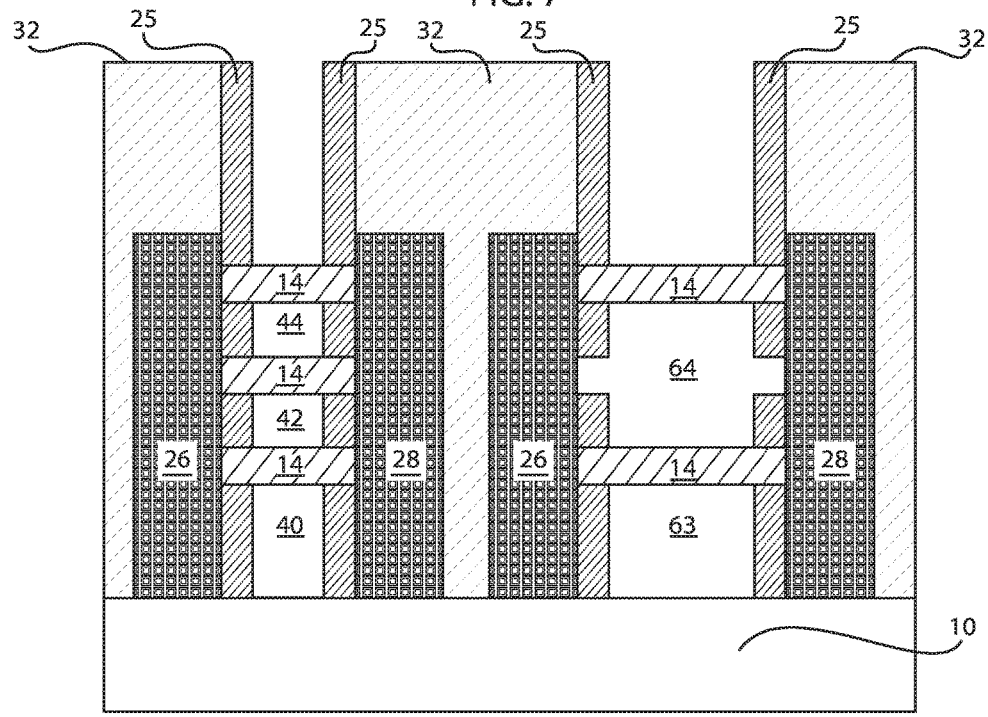
Figure 9:
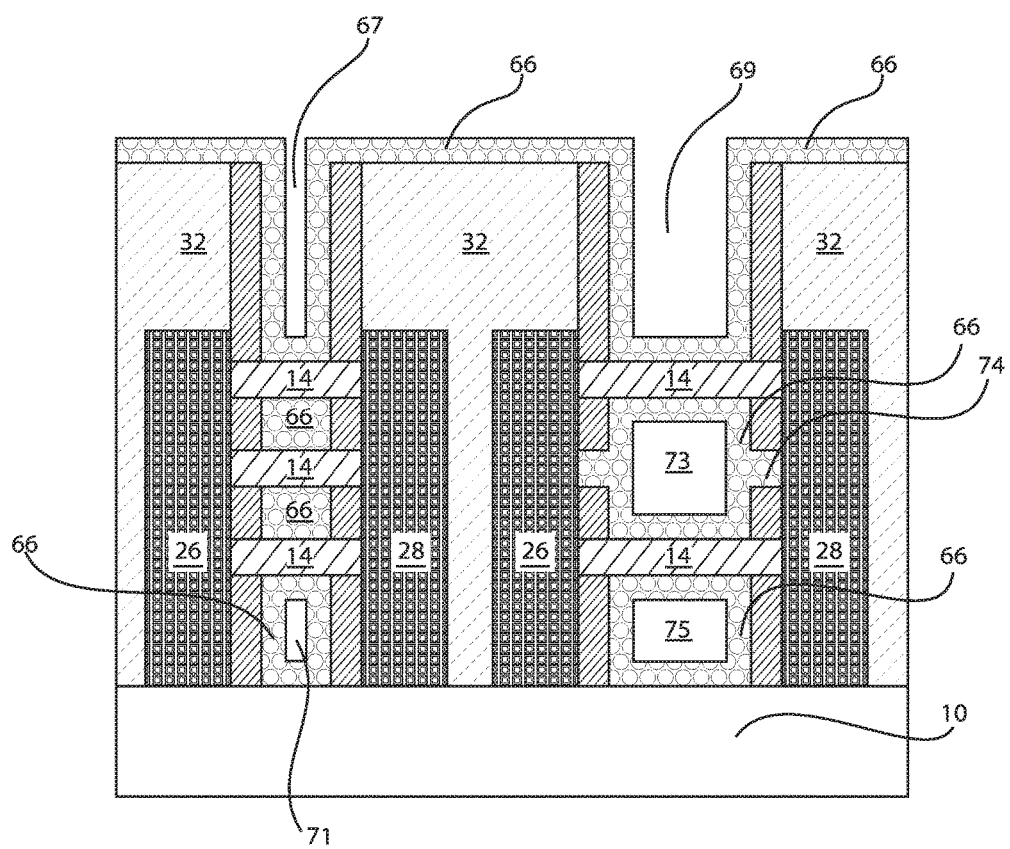
Figure 10:
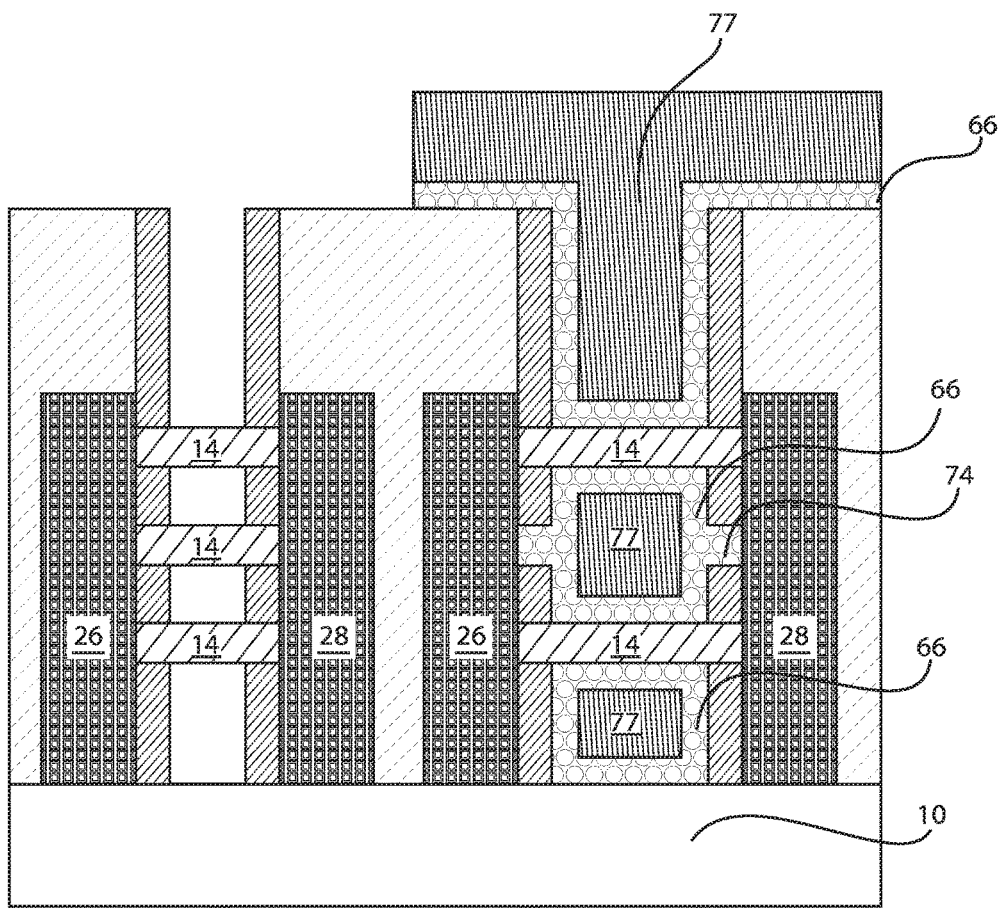
Figure 11:
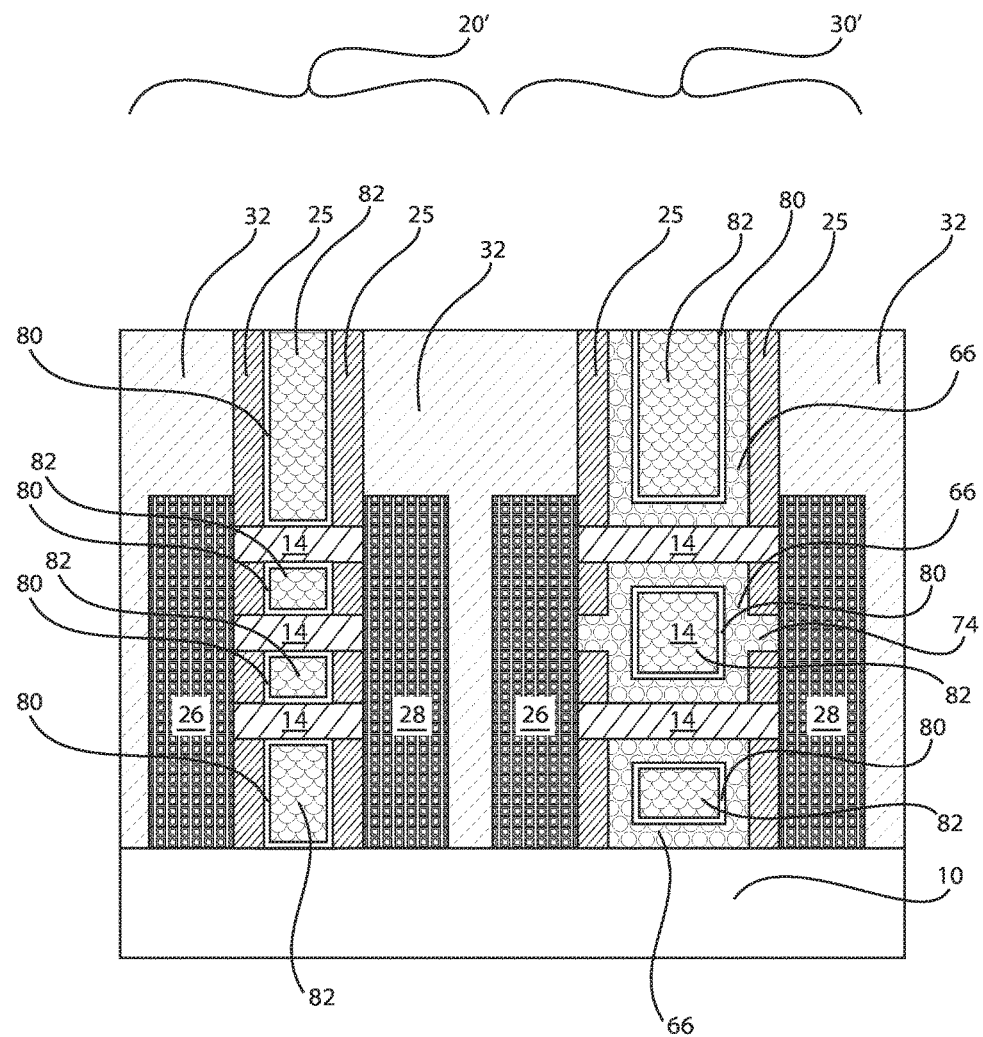

and a thick gate dielectric FET, in accordance with an embodiment of the present invention;

FIG. 3 is a cross-sectional view of the semiconductor structure of FIG. 2 where an inter-level dielectric (ILD) is formed over the thin gate dielectric FET and the thick gate dielectric FET, in accordance with an embodiment of the present invention;

FIG. 4 is a cross-sectional view of the semiconductor structure of FIG. 3 where dummy gates of the thin gate dielectric FET and the thick gate dielectric FET are removed, in accordance with an embodiment of the present invention;

FIG. 5 is a cross-sectional view of the semiconductor structure of FIG. 4 where sacrificial layers of the thin gate dielectric FET and the thick gate dielectric FET are selectively removed, in accordance with an embodiment of the present invention;

FIG. 6 is a cross-sectional view of the semiconductor structure of FIG. 5 where the thick gate dielectric FET is covered with a block mask and further sacrificial layers are removed from the thin gate dielectric FET, in accordance with an embodiment of the present invention;

FIG. 7 is a cross-sectional view of the semiconductor structure of FIG. 6 where the block mask of the thick gate dielectric FET is removed and a low temperature anneal is performed on the remaining sacrificial layers of the thick gate dielectric FET, in accordance with an embodiment of the present invention;

FIG. 8 is a cross-sectional view of the semiconductor structure of FIG. 7 where the oxide of the thick gate dielectric FET formed from the anneal is removed, in accordance with an embodiment of the present invention;

FIG. 9 is a cross-sectional view of the semiconductor structure of FIG. 8 where a thick oxide is deposited over the thin gate dielectric FET and the thick gate dielectric FET, in accordance with an embodiment of the present invention;

FIG. 10 is a cross-sectional view of the semiconductor structure of FIG. 9 where a block mask is deposited over the thick gate dielectric FET and the oxide layer of the thin gate dielectric FET is removed, in accordance with an embodiment of the present invention; and FIG. 11 is a cross-sectional view of the semiconductor structure of FIG. 10 where the block mask of the thick gate dielectric FET is removed and a high-k metal gate (HKMG) is formed over both the thin gate dielectric FET and the thick gate dielectric FET, in accordance with an embodiment of the present invention.

Throughout the drawings, same or similar reference numerals represent the same or similar elements.

DETAILED DESCRIPTION

Embodiments in accordance with the present invention provide methods and devices for integrating thin and thick gate dielectric nanosheet transistors. Nanosheets provide for viable device architectures for scaling complementary metal oxide semiconductors (CMOS) beyond the 7 nm node. Thin gate dielectric nanosheet transistors can be used, e.g., for logic and static random access memory (SRAM) applications, whereas thick gate dielectric nanosheet transistors can be used, e.g., for high voltage applications.

Embodiments in accordance with the present invention provide methods and devices for integrating thin and thick gate dielectric nanosheet transistors by employing coplanar nanosheets in thin and thick gate dielectric transistor regions. Stated differently, nanosheets in the thin and thick gate dielectric transistor regions are at a same level. The nanosheet gap in the thick dielectric transistor region is widened or expanded by selectively removing an intermedium or intermediate nanosheet, which is oxidized by low temperature oxidation before gate stack deposition.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
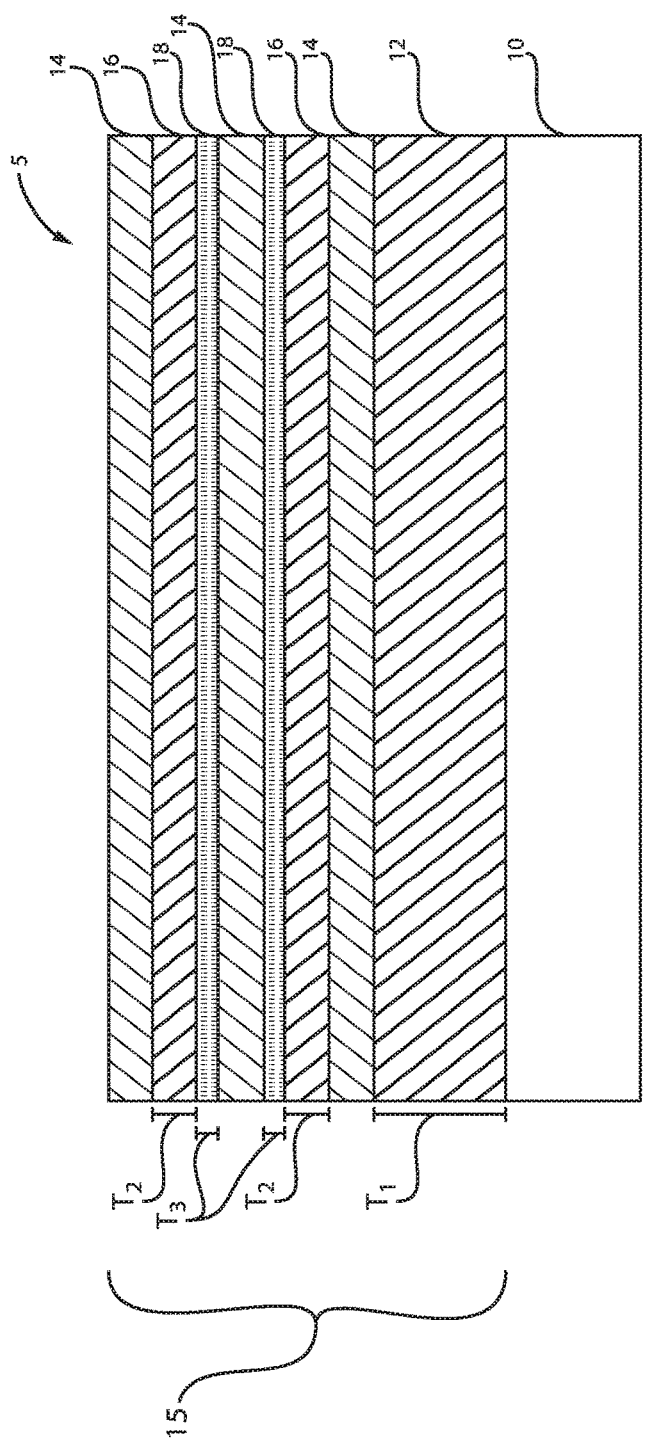
FIG. 1 is a cross-sectional view of a semiconductor structure including alternating layers of a first semiconductor material and a second semiconductor material formed over a substrate, in accordance with an embodiment of the present invention.

FIG. 1 is a cross-sectional view of a semiconductor structure including alternating layers of a first semiconductor material and a second semiconductor material formed over a substrate, in accordance with an embodiment of the present invention.

A semiconductor structure 5 includes a semiconductor substrate 10. A nanosheet stack 15 can be formed over the substrate 10. The substrate 10 can be, e.g., a silicon (Si) substrate. The nanosheet stack 15 can include, e.g., alternating layers of a first material 12 and a second material 14. The first material 12 can be silicon germanium (SiGe) and the second material 14 can be silicon (Si). However, two types of SiGe layers are formed. That is, SiGe layers 12, 16 having a high germanium (Ge) content and SiGe layers 18 having a low Ge content. In some embodiments, the high content of Ge can be approximately between about 40-50 at. % Ge (atomic percentage of Ge), whereas the low content Ge can be approximately about 20-30 at. % Ge.

Examples of semiconductor materials that can be used in forming such nanosheet structures include at least silicon (Si), germanium (Ge), silicon germanium alloys (SiGe), silicon carbide (SiC), silicon germanium carbide (SiGeC), III-V compound semiconductors and/or II-VI compound semiconductors. One skilled in the art can contemplate a number of different semiconductor materials for forming the nanosheet structures.

In the exemplary embodiment, three Si layers 14 are depicted. However, Si layers can also be more than three layers in other exemplary embodiments. The top and bottom surfaces of the second Si layer 14 can be in direct contact with SiGe layers 18. The first SiGe layer 12 can have a thickness of T1, whereas the second and third SiGe layers 16 can have a thickness of T2. The thickness T1 can be greater than the thickness T2. The second and third SiGe layers 16 can be approximately equal or different. The SiGe layers 18 can have a thickness T3. The thickness T3 can be less than the thickness T1 and less than the thickness T2. Thus, one Si layer 14 is sandwiched directly between two low Ge content SiGe layers 18 that are thinner than the rest of the SiGe layers 12, 16 within the nanosheet stack 15. Non-limiting thickness of each layer can be, e.g., T1: 15-20 nm, T2: 6-10 nm, T3: 3-5 nm. The thickness of Si layers ranges from about 5 nm to about 12 nm.

Each of the layers can be formed on top of the previous layer by epitaxial growth or any other appropriate deposition process. Epitaxial growth at this stage can be performed with relatively high quality, as each previous layer provides a good seed layer for the growth of the next layer.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

FIG. 2 is a cross-sectional view of the semiconductor structure of FIG. 1 where a nanosheet structure is formed including a thin gate dielectric field effect transistor (FET) and a thick gate dielectric FET, in accordance with an embodiment of the present invention.

In various example embodiments, a thin gate dielectric FET 20 and a thick gate dielectric FET 30 are formed. Each of the FETs 20, 30 is formed by creating nanosheet structures 11, 13, a dummy gate 22 over each of the nanosheet structures 11, 13, and a hardmask 24 over the dummy gate 22. The hardmask 24 has an exposed top surface 23. Spacers 25 are formed adjacent the nanosheet structures 11, 13. Source region 26 and drain region 28 are formed adjacent the nanosheet structures 11, 13 and adjacent a section of the spacers 25. The thin gate dielectric FET 20 is separated from the thick gate dielectric FET 30 by a region 21. The spacers 25 can extend a length of the nanosheets 11, 13, the dummy gate 22 and the hardmask 24. The source region 26 and the drain region 28 extend a length of the nanosheets 11, 13. In particular, the source region 26 and drain region 28 extends above a top surface of the highest Si layer or channel 14.

The first stack of alternating layers of the first nanosheet transistor 20 is coplanar with the second stack of alternating layers of the second nanosheet transistor 30. In other words, the height of the first nanosheet structure 11 is approximately equal to the height of the second nanosheet structure 13.

FIG. 3 is a cross-sectional view of the semiconductor structure of FIG. 2 where an inter-level dielectric (ILD) is formed over the thin gate dielectric FET and the thick gate dielectric FET, in accordance with an embodiment of the present invention.

In various example embodiments, a dielectric layer 32 (e.g., an oxide layer) is then deposited over the thin gate dielectric FET 20 and the thick gate dielectric FET 30. The dielectric layer 32 can be an interlevel dielectric (ILD). In various embodiments, a height of the dielectric layer 32 can be reduced by chemical-mechanical polishing (CMP) and/or etching. Other suitable dielectric materials for forming the ILD include but are not limited to, silicon oxide, silicon nitride, silicon oxynitride, SiCO, SiCON, or any suitable combination of such materials.

FIG. 4 is a cross-sectional view of the semiconductor structure of FIG. 3 where dummy gates of the thin gate dielectric FET and the thick gate dielectric FET are removed, in accordance with an embodiment of the present invention.

In various example embodiments, the dummy gate 22 and the hardmask 24 are etched away. The etching can include a dry etching process such as, for example, reactive ion etching, plasma etching, ion etching or laser ablation. The etching can further include a wet chemical etching process in which one or more chemical etchants are used to remove portions of the layers.

The etching results in a recess 34 formed within the channel of the thin gate dielectric FET 20 and a recess 36 within the thick gate dielectric FET 30. The etching also exposes a portion of an inner surface 35 of spacers 25 of the thin gate dielectric FET 20 and further exposes a portion of an inner surface 37 of spacers 25 of the thick gate dielectric FET 30. A width of the first channel (thin FET) is designated as "X1" and a width of the second channel (thick FET) is designated as "X2." The etching also results in exposure of a top surface 15 of the top Si layer 14.

FIG. 5 is a cross-sectional view of the semiconductor structure of FIG. 4 where sacrificial layers of the thin gate dielectric FET and the thick gate dielectric FET are selectively removed, in accordance with an embodiment of the present invention.

In various example embodiments, the SiGe layers 12 (high Ge content) are selectively removed from both the thin and thick gate dielectric FETs 20, 30. However, the SiGe layers 18 remain intact. The SiGe layers 18 are the low Ge content (e.g., between about 20-30 at. % Ge) layers. These two SiGe layers 18 directly contact the middle Si layer 14. Stated differently, the middle Si layer or channel 14 is sandwiched directly between the two SiGe layers 18 (low Ge). The selective etching of SiGe layers 12 (high Ge) results in gaps 40, 42, 44 formed within the channel of the thin gate dielectric FET 20 and gaps 50, 52, 54 formed within the channel of the thick gate dielectric FET 30. In some embodiments, the selective removal of the SiGe layers 12 is performed by hydrochloride gas at a temperature ranging from about 500° C. to about 800° C.

FIG. 6 is a cross-sectional view of the semiconductor structure of FIG. 5 where the thick gate dielectric FET is covered with a block mask and further sacrificial layers are removed from the thin gate dielectric FET, in accordance with an embodiment of the present invention.

In various example embodiments, a block mask 60 is deposited over the thick gate dielectric FET 30. Then the SiGe layers 18 are selectively removed from the thin gate dielectric FET 20. Thus, the three Si layers or channels 14 remain intact. The top and bottom surfaces of all three Si layers (top, middle, and bottom) or channels 14 are now exposed.

FIG. 7 is a cross-sectional view of the semiconductor structure of FIG. 6 where the block mask of the thick gate dielectric FET is removed and an anneal process is performed on the remaining sacrificial layers of the thick gate dielectric FET, in accordance with an embodiment of the present invention.

In various example embodiments, the block mask 60 is stripped to expose the channel of the thick gate dielectric FET 30 in the form of gaps 63. An anneal 61 is then performed to oxidize the middle Si layer 14. The anneal 61 results in transforming or converting the middle Si layer 14 and the SiGe layers 18 (low Ge) into a single uniform oxide section 62. There are a number of ways for converting the Si and SiGe into oxide. In the one method, the low-temperature anneal is performed in an environment including oxygen species (e.g., water vapor). The oxygen species preferably reacts with silicon in the SiGe layer and primarily forms silicon oxide. Germanium is pushed towards the middle Si layer, converting the middle Si layer into silicon germanium. Such a process is often referred to as a condensation process. As the oxidation process continues, the germanium concentration in the middle of the structure increases, and eventually the entire structure is oxidized, thus resulting in silicon oxide mixed with silicon germanium oxide. In another method, the anneal is a two-step process. First, the annealing is performed in an environment that does not contain oxygen. Germanium diffusion occurs during this annealing process. SiGe shells and Si middle layer become SiGe (the Ge at. % of the SiGe layer after annealing will be lower than Ge at. % of the original SiGe shell). A second annealing with oxidation is then performed to preferably oxidize SiGe (in other words, oxidation of SiGe is much faster than Si). In any method, there may be a thin oxide formed on the exposed surface of Si nanosheet. The thin oxide will be removed during the subsequent oxide removal step.

FIG. 8 is a cross-sectional view of the semiconductor structure of FIG. 7 where the oxide of the thick gate dielectric FET formed from the anneal is removed, in accordance with an embodiment of the present invention. In some embodiments, the oxide is removed by a wet etch process including hydrofluoride acid.

In various example embodiments, the oxide section 62 is removed thus resulting in widened or expanded gap 64 formed between the top Si layer 14 and the bottom Si layer 14. Therefore, by removing a middle Si layer 14 or middle Si channel from the thick gate dielectric transistor 30, by encasing it or enclosing it or surrounding it with lower content SiGe layers 18 or films, and subsequently selectively oxidizing 61 to form section 62 by a combination of condensation and low temperature oxidation allows for the integration of the thick gate dielectric transistor 30 with the thin gate dielectric transistor 20.

FIG. 9 is a cross-sectional view of the semiconductor structure of FIG. 8 where a thick oxide is deposited over the thin gate dielectric FET and the thick gate dielectric FET, in accordance with an embodiment of the present invention.

In various example embodiments, a thick dielectric, such as a thick oxide 66 is deposited over both the thin and thick gate dielectric FETs 20, 30. The deposition of the thick oxide 66 results in gap regions 67, 71 within the channel of the thin gate dielectric FET 20 and results in gap regions 69, 73, 75 within the channel of the thick gate dielectric FET 30.

Moreover, oxide pinch-off 74 is exhibited adjacent the gap region 73 of the thick gate dielectric 30. In other words, the thick gate oxide 66 pinches off a section of the spacer 25 such that the thick oxide 66 contacts the source and drain regions 26, 28. Thus, the pinched off thick gate oxide 74 becomes part of the spacer 25. Stated differently, the pinched off oxide 74 takes the place of the spacer sections 25. This results in a physical connection between the thick oxide 66 and the source and drain regions 26, 28. Therefore, the expanded or widened gap 64 formed after oxide removal (and between the two nanosheets of the thick gate dielectric nanosheet transistor 30) is pinched off by the thick oxide or thick gate dielectric 66. As a result, pinch off occurs in or within expanded or widened gap 64. No pinch off occurs in the thin gate dielectric nanosheet transistor 20. Instead, the thin gate dielectric nanosheet transistor 20 exhibits different vertical gaps between adjacent nanosheets. The bottom gap is wider than the other two gaps. This is shown in FIG. 8 where gap 40 is greater than gaps 42, 44.

The thick oxide 66 can be deposited by atomic layer deposition (ALD) techniques. ALD is a gas phase chemical process used to create extremely thin coatings. Alternatively, the thick oxide 66 can be deposited by any other suitable deposition techniques, including but not limited to chemical vapor deposition (CVD), plasma-enhanced CVD, low temperature oxide deposition (LTO), and ozone oxide deposition. A non-limiting thickness of the thick oxide can be about 3-6 nm.

FIG. 10 is a cross-sectional view of the semiconductor structure of FIG. 9 where a block mask is deposited over the thick gate dielectric FET and the oxide layer of the thin gate dielectric FET is removed, in accordance with an embodiment of the present invention.

In various example embodiments, a block mask 77 is deposited over the thick gate dielectric FET 30 and the thick oxide 66 is removed or stripped from the thin gate dielectric transistor 20.

FIG. 11 is a cross-sectional view of the semiconductor structure of FIG. 10 where the block mask of the thick gate dielectric FET is removed and a high-k metal gate (HKMG) is formed over both the thin gate dielectric FET and the thick gate dielectric FET, in accordance with an embodiment of the present invention.

In various example embodiments, the block mask 77 is removed. Additionally, a high-k metal gate (HKMG) 80, 82 is deposited over the thin and thick gate dielectric FETs 20, 30 in order to form final structures 20' and 30', respectively. The final structure 20' thus includes three nanosheets and the final structure 30' thus includes two nanosheets. The three nanosheets of structure 20' are separated from each other by a first distance, whereas the two nanosheets of structure 30' are separated from each other by a second distance. The second distance is greater than the first distance. Additionally, the thick oxide 66 is formed between the two nanosheets of the thick gate dielectric nanosheet transistor 30' such that the thick oxide 66 pinches off a section of a spacer 25 or spacers 25 formed between the thick oxide 66 and source and drain regions 26, 28. Thick oxide pinch off can be exhibited on both sides of the nanosheet stack. Thick oxide pinch off can occur such that the source and drain regions 26, 28 both directly contact the thick oxide 66 between the two nanosheets of the thick gate dielectric nanosheet transistor 30'. Stated differently, the pinched off thick gate oxide 74 becomes part of the spacer 25 (or replaces the spacer section) as the gap generated between the thick oxide 66 and the source and drain regions 26, 28 is eliminated.

The case of 3 sheets for the thin gate dielectric transistor and 2 sheets for the thick gate dielectric is just an example. The thin gate dielectric transistor could have 4 sheets (a top sheet, a bottom sheet, and two middle sheets), while the thick dielectric transistor could have 2 sheets (with top sheet and bottom sheet remaining, the middle 2 sheets are converted to oxide and removed). In another example, the thin gate dielectric transistor can have 5 sheets (from top to bottom, sheets 1, 2, 3, 4, 5). The thick gate dielectric transistor has only sheets 1, 3, and 5 with sheets 2 and 4 removed. In another example, the thin gate dielectric transistor can have 5 sheets (from top to bottom, sheets 1, 2, 3, 4, 5). The thick gate dielectric transistor has only sheets 1 and 5 with sheets 2, 3, 4 being removed. Therefore, for the thick gate dielectric transistor, at least one middle sheet is removed to widen the gap between remaining sheets. Structurally, if the vertical distance is measured (from the middle of each remaining sheet) between remaining sheets, and if the vertical distance is referred to as pitch, the pitch of the thick dielectric transistor will be an integer times of the pitch of the thin dielectric transistor.

Therefore, transistors with thin and thick gate dielectrics can be compatible on a single chip. The thin gate dielectric transistor 20' can be used for logic and static random access memory (SRAM), whereas the thick gate dielectric transistor 30' can be used for high voltage applications.

In summary, by removing a middle Si layer or middle Si channel from the thick gate dielectric transistor 30', by encasing the middle Si layer or enclosing the middle Si layer or surrounding the middle Si layer with lower content SiGe layers or films, and subsequently selectively oxidizing such section by a combination of condensation and low temperature oxidation allows for the integration of the thick gate dielectric transistor 30' with the thin gate dielectric transistor 20'. The nanosheets in the thin and thick gate dielectric transistors 20', 30' are coplanar, thus avoiding any topography issues. The nanosheets in the thin and thick gate dielectric transistors 20', 30' are at the same level (or same height). The nanosheet gap in the thick dielectric transistor 30' is widened or expanded by selectively removing an intermediate Si layer by oxidizing such layer (and adjacent SiGe layer having low at. % Ge) by low temperature oxidation before the deposition of the gate stack. Oxide pinch off also occurs in the thick gate dielectric nanosheet transistor such that spacer sections are eliminated to allow the pinched off oxide region or area to directly contact source and/or drain regions.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for integrating a first gate dielectric nanosheet transistor and a second gate dielectric nanosheet transistor on a single chip (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for integrating a first gate dielectric nanosheet transistor and a second gate dielectric nanosheet transistor on a single chip, the method comprising:
   forming a first stack of alternating layers for the first gate dielectric nanosheet transistor and a second stack of alternating layers for the second gate dielectric nanosheet transistor;
   selectively removing a first set of sacrificial layers of the first stack of alternating layers of the first gate dielectric nanosheet transistor and selectively removing a first set of sacrificial layers of the second stack of alternating layers of the second gate dielectric nanosheet transistor;
   selectively removing a second set of sacrificial layers of the first stack of alternating layers;
   annealing a second set of sacrificial layers of the second stack of alternating layers to subsequently remove the second set of sacrificial layers of the second stack of alternating layers; and
   forming the first gate dielectric nanosheet transistor and the second gate dielectric nanosheet transistor.

2. The method of claim 1, wherein the first gate dielectric nanosheet transistor is a thin gate dielectric nanosheet transistor and the second gate dielectric nanosheet transistor is a thick gate dielectric nanosheet transistor.

3. The method of claim 1, wherein the first set of sacrificial layers of the first and second stacks of alternating layers are silicon germanium (SiGe) layers having a high concentration of germanium (Ge).

4. The method of claim 3, wherein the high concentration of Ge is about 40-50 atomic percentage (at. %) Ge.

5. The method of claim 1, wherein the second set of sacrificial layers of the first and second stacks of alternating layers are silicon germanium (SiGe) layers having a low concentration of germanium (Ge).

6. The method of claim 5, wherein the low concentration of Ge is about 20-30 at. % Ge.

7. The method of claim 1, further comprising:
   depositing a dielectric layer over the first and second gate dielectric nanosheet transistors;
   depositing a block mask over the second gate dielectric nanosheet transistor to selectively remove the dielectric layer from the first gate dielectric nanosheet transistor;
   stripping the block mask; and
   depositing a high-k metal gate (HKMG) stack over the first and second gate dielectric nanosheet transistors.

8. The method of claim 1, further comprising removing dummy gates of the first and second gate dielectric nanosheet transistors before selectively removing the first set of sacrificial layers of the first and second stacks of alternating layers.

9. A method for integrating a thin gate dielectric nanosheet transistor and a thick gate dielectric nanosheet transistor on a single chip, the method comprising:
   forming a first stack of alternating silicon (Si) and silicon germanium (SiGe) layers for the thin gate dielectric nanosheet transistor and a second stack of alternating Si and SiGe layers for the thick gate dielectric nanosheet transistor;
   depositing a first dielectric layer over the thin and thick gate dielectric nanosheet transistors;
   removing dummy gates of the thin and thick gate dielectric nanosheet transistors;
   selectively removing a first set of sacrificial SiGe layers of the first and second stacks of alternating layers such that a second set of sacrificial layers remains in direct contact with a Si layer of each of the first and second stacks of alternating Si and SiGe layers;
   selectively removing a second set of sacrificial SiGe layers of the first stack of alternating Si and SiGe layers such that only Si layers remain;
   oxidizing and removing a second set of sacrificial SiGe layers and Si layer sandwiched by the second set of sacrificial SiGe layers of the second stack of alternating Si and SiGe layers; and
   forming the first gate dielectric nanosheet transistor and the second gate dielectric nanosheet transistor.

10. The method of claim 9, further comprising:
    depositing a second dielectric layer over the thin and thick gate dielectric nanosheet transistors;
    depositing a block mask over the thick gate dielectric nanosheet transistor;
    selectively removing the second dielectric layer from the thin gate dielectric nanosheet transistor;
    stripping the block mask; and
    depositing a high-k metal gate (HKMG) stack over the thin and thick gate dielectric nanosheet transistors.

11. The method of claim 9, wherein the first set of sacrificial SiGe layers of the first and second stacks of alternating Si and SiGe layers have about a 40-50 atomic percentage (at. %) concentration of Ge.

12. The method of claim 9, wherein the second set of sacrificial SiGe layers of the first and second stacks of alternating Si and SiGe layers have about a 20-30 at. % concentration of Ge.

13. A semiconductor structure, comprising:
    a single nanosheet stack formed over a substrate;
    a thin gate dielectric nanosheet transistor formed by fabricating a first portion of the single nanosheet stack, the thin gate dielectric nanosheet transistor including a plurality of nanosheets separated from each other by a first distance; and a thick gate dielectric nanosheet transistor formed by fabricating a second portion of the single nanosheet stack, the thick gate dielectric nanosheet transistor including a plurality of nanosheets separated from each other by a second distance, the second distance being greater than the first distance.

14. The structure of claim 13, wherein the plurality of nanosheets of the thin gate dielectric nanosheet transistor includes a top nanosheet, a bottom nanosheet, and one or more middle nanosheets formed between the top and bottom nanosheets.

15. The structure of claim 14, wherein the plurality of nanosheets of the thin gate dielectric nanosheet transistor are separated from each other such that different vertical gaps are formed between adjacent nanosheets.

16. The structure of claim 15, wherein the plurality of nanosheets of the thick gate dielectric nanosheet transistor includes a top nanosheet and a bottom nanosheet.

17. The structure of claim 16, wherein a thick oxide is formed between the top and bottom nanosheets of the thick gate dielectric nanosheet transistor such that the thick oxide pinches off a section of a spacer formed between the thick oxide and source and drain regions.

18. The structure of claim 17, wherein a high-k metal gate is formed in direct contact with the thick oxide of the thick gate dielectric nanosheet transistor.

19. The structure of claim 17, wherein a high-k metal gate is formed in direct contact with each of the plurality of nanosheets of the thin gate dielectric nanosheet transistor.

20. The structure of claim 13, wherein the plurality of nanosheets of the thin gate dielectric nanosheet transistor are coplanar with the plurality of nanosheets of the thick gate dielectric nano sheet transistor.

* * * * *